US007279939B2

(12) United States Patent
Burleson et al.

(10) Patent No.: US 7,279,939 B2
(45) Date of Patent: Oct. 9, 2007

(54) CIRCUIT FOR DIFFERENTIAL CURRENT SENSING WITH REDUCED STATIC POWER

(75) Inventors: Wayne Burleson, Shutesbury, MA (US); Vishak Venkotroman, Amherst, MA (US); Atul Maheshwari, Portland, OR (US)

(73) Assignee: University of Massachusetts, Boston, MA (US)

( * ) Notice: Subject to any disclaimer, the term of this patent is extended or adjusted under 35 U.S.C. 154(b) by 148 days.

(21) Appl. No.: 11/113,614

(22) Filed: Apr. 25, 2005

(65) Prior Publication Data

US 2005/0237088 A1 Oct. 27, 2005

Related U.S. Application Data

(60) Provisional application No. 60/565,454, filed on Apr. 26, 2004.

(51) Int. Cl.
*G01R 19/00* (2006.01)
(52) U.S. Cl. .............................. 327/51; 327/55; 327/57
(58) Field of Classification Search .................. None
See application file for complete search history.

(56) References Cited

U.S. PATENT DOCUMENTS

| | | | | | |
|---|---|---|---|---|---|
| 4,169,233 | A | * | 9/1979 | Haraszti | 327/57 |
| 4,973,864 | A | * | 11/1990 | Nogami | 327/55 |
| 5,192,878 | A | * | 3/1993 | Miyamoto et al. | 327/77 |
| 5,828,241 | A | * | 10/1998 | Sukegawa | 327/67 |
| 6,281,714 | B1 | * | 8/2001 | Ang et al. | 327/56 |
| 6,351,155 | B1 | * | 2/2002 | Pogrebnoy | 327/51 |
| 6,424,181 | B1 | * | 7/2002 | Pogrebnoy | 327/55 |
| 6,642,749 | B1 | * | 11/2003 | Wu et al. | 327/55 |

OTHER PUBLICATIONS

Maheshwari et al., "Current Sensing Techniques for Global Interconnects in Very Deep Submicron (VDSM) CMOS," *IEEE Computer Society Workshop on VLSI*, (2001) pp. 66-70.
Maheshwari et al., "Repeater and Current-sensing Hybrid Circuits for On-chip Interconnects," *ACM Great lakes Symposium on VSLI*, (2001) pp. 269-272.
Wicht et al., "A1.5V 1.7ns 4k×32 SRAM with a Fully-Differential Auto-Power-Down Current Sense Amplifier," *Proceedings at the IEEE International Solid State Circuits Conference*, (2004).
Gray et al., *Wave Pipelining: Theory and CMOS Implementation*, Kluwer Academic Publishers (1980) Chapter 7, 7.3 SAMPLER.

(Continued)

*Primary Examiner*—Tuan T Lam
(74) *Attorney, Agent, or Firm*—Moore & Van Allen PLLC; Steven B. Phillips

(57) ABSTRACT

Returning to FIG. 2, sense circuit 201 represents the circuit that must sense the signaling on an interconnect. NMOS device 202 is always on so that there is a continuous path to ground whenever PMOS driver 204 is on. Since leakage power is an order of magnitude less than static and dynamic power it can be omitted for clarity, although it should be noted that dynamic power increases with respect to line length since the interconnect capacitance increases as line length increases. Static power is due to flow of static current across the two resistances shown in FIG. 2, interconnect resistance 206 and the resistance of transistors 102 and 104 from FIG. 1, represented by the resistance of equivalent NMOS transistor 208 of FIG. 2.

9 Claims, 3 Drawing Sheets

OTHER PUBLICATIONS

Sylvester et al., "Power-Driven Challenges in Nanometer Design," *Design and test of Computer*, (2001) pp. 12-21.

Sylvester et al., "Getting to the Bottom of Deep Submicron II: A Global Wiring Paradigm," *Proceedings of the International Symposium on Physical Design*, (1999) pp. 193-200.

Zhang et al., "Low-Swing On-Chip Signaling Techniques: Effectiveness and Robustness," *Transactions on Very Large Scale Integration (VLSI) Systems*, (Jun. 2000), vol. 8, No. 3.

Bakoglu, *Circuits, Inerconnections, and Packaging*, Addison-Wesley, (1990) Chapter 5 Interconnection Resistance, 5.4.2 Repeaters.

Bushirullah, et al., "Delay and Power Model for Current-Mode Signaling in Deep Submicron Global Interconnects," *Proceeding of Custom Integrated Circuits Conference*, (2002) pp. 513-516.

Borkar, "Low Power Design Challenges for the Decade," *Proceeding of Design Automation Conference*, (2001) pp. 293-296.

* cited by examiner

US 7,279,939 B2

CIRCUIT FOR DIFFERENTIAL CURRENT SENSING WITH REDUCED STATIC POWER

CROSS-REFERENCE TO RELATED APPLICATION

This application claims priority from co-pending, provisional patent application Ser. No. 60/565,454, filed Apr. 26, 2004 by the inventors hereof, the entire disclosure of which is incorporated herein by reference.

BACKGROUND

Following Moore's law and current scaling trends suggests that handling power dissipation in microprocessors is gradually becoming impractical, stressing the need for circuit designs that reduce active and leakage power. Additionally, global interconnects can be a limiting factor for performance since interconnect delay increases quadratically with increase in the length of the wire. Both voltage-mode techniques and current-mode techniques have been used to reduce this trend in interconnect delay. However, the power dissipation due to interconnect circuitry such as repeaters can significantly increase the power dissipation of a chip, at least in part due to the static power dissipation of such circuits.

A differential current sense amplifier (DCSA), can be applied to global interconnects. Such a circuit provides current-mode signaling, which, unlike voltage-mode signaling, provides a low impedance termination at the receiver. FIG. 1 illustrates such a DCSA circuit, 100. In DCSA 100, the drains of transistors 102 and 104 are used for low impedance termination. This termination effectively clamps the interconnect at a specified voltage. Standard inverter based drivers provide the current push or pull to the voltage clamped interconnect wires. Two interconnect wires connect the signal and its complement to either input on the differential current sense amplifier (DCSA). A cross coupled inverter pair is formed by transistors 106, 108, 110, and 112. During an equalizing phase these cross coupled inverters are held at meta stable state by an NMOS device 114. The evaluation phase begins once the equalizing signal, EQ is turned off. In this phase, small current differences will force the cross coupled inverters out of the meta stable state. Positive feedback amplifies the input signals and gives nearly full scale voltages at the outputs. In general this approach is faster than voltage-mode repeater based interconnects, and performs especially well in highly capacitive wires.

SUMMARY

Embodiments of the present invention provide a reduced static power differential current sense amplifier (DCSA) that can use a self-timed shutoff system to disable the sense amplifier after sensing is done and enable the sense amplifier before the start of sensing. The reduced static power DCSA may be referred to herein as a "power-aware" DCSA (PA-DCSA) and can be used in interconnects between logic elements of a microprocessor or other semiconductor device to reduce power dissipation.

A current sense amplifier according to at least some embodiments of the present invention includes at least two cross-coupled inverters, one having an output electrically connected to an out terminal and another output electrically connected to an out bar terminal. A decoupling mechanism connected to the cross-coupled inverters can be provided. The decoupling mechanism accepts a sense enable (SE) signal that selectively enables and disables the current sense amplifier. A discharge mechanism can also be connected to the cross-coupled inverters to remove excess charge when the sense amplifier is disabled. A selectively enabled low impedance path from the cross-coupled inverters to ground can also be provided. This path is provided when both the SE signal and an equalizing (EQ) signal are high. When the EQ signal goes low and the voltage swings at the out terminals, the low impedance path and the decoupling mechanism are shut off and the inverters are discharged.

In at least some embodiments, the decoupling mechanism can be provided by two decoupling devices or transistors connected one each to a cross-coupled inverter and gated by the SE signal. The discharge mechanism can similarly be implemented by two discharge devices or transistors. The selectively enabled low-impedance path can also be provided by a transistor. The transistor implementing the low-impedance path can be gated by the SE signal so that the low-impedance path is enabled and disabled as needed. Thus, in at least some embodiments an arrangement of transistors provides the means to operate the PA-DCSA.

DETAILED DESCRIPTION OF EXAMPLE EMBODIMENT(S)

The present invention will now be described in terms of specific, example embodiments. It is to be understood that the invention is not limited to the example embodiments disclosed. It should also be understood that not every feature of the devices or methods described is necessary to implement the invention as claimed in any particular one of the appended claims. Various elements, steps, processes, and features of various embodiments of the invention are described in order to fully enable the invention. It should also be understood that throughout this disclosure, where a method is shown or described, the steps of the method may be performed in any order or simultaneously, unless it is clear from the context that one step depends on another being performed first.

Figure 1:
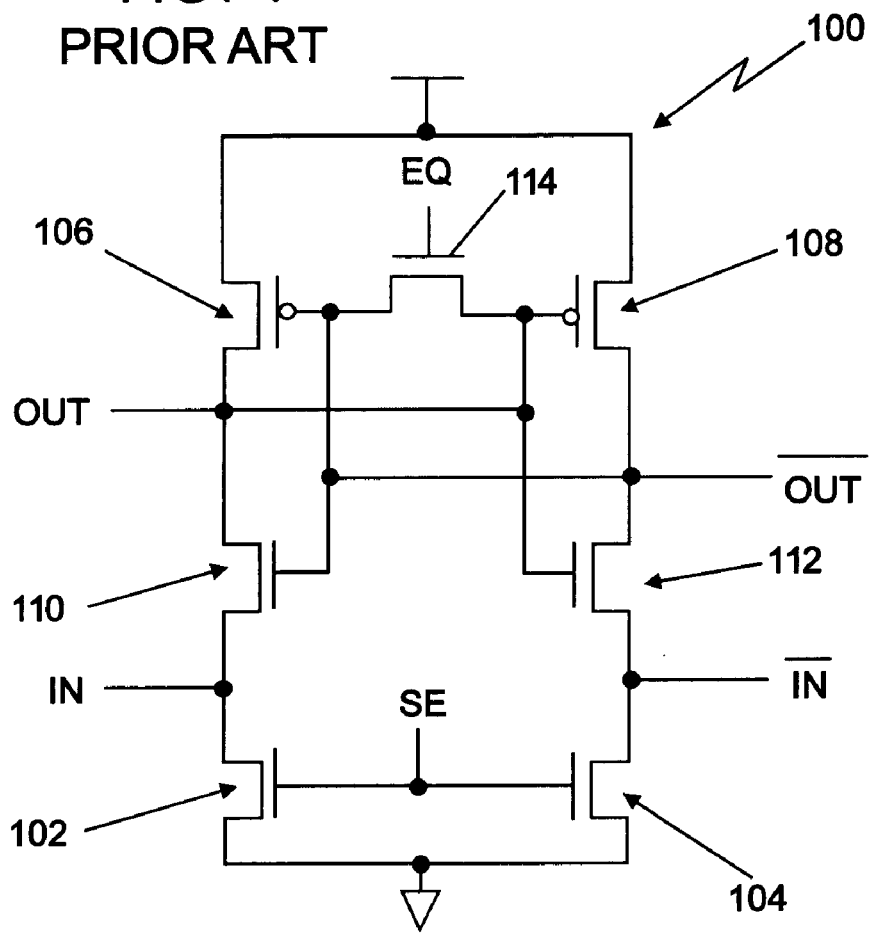
FIG. 1 is a schematic diagram of an example DCSA circuit.
Figure 2:
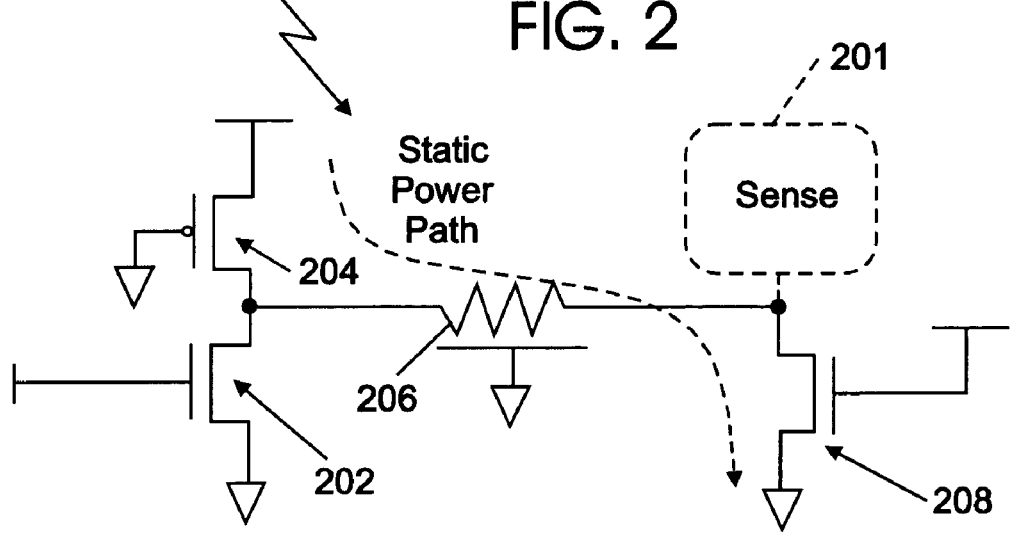
FIG. 2 is an illustration of the static power dissipation paths in DCSA circuits that is presented in order to aid in the understanding of the operation of the PA-DCSA circuit of embodiments of the present invention.

The design and operation of the PA-DCSA according to embodiments of the present invention can more easily be understood by examining a power analysis of a DCSA circuit. FIG. 2 illustrates an equivalent circuit, 200, which aids the understanding of this power analysis. For example, the three major source of power dissipation in a circuit like that shown in FIG. 1 and be represented by the following equation:

$$P_{DCSA} = P_{dynamic} + P_{direct\text{-}path} + P_{leakage}.$$

$P_{dynamic}$ in the equation above refers to the switching power due to the charging and discharging of the interconnect capacitance. $P_{direct\text{-}path}$ refers to the power dissipated in a direct path power between $V_{dd}$ and ground which represented by the dashed arrow in equivalent circuit 200 of FIG. 2. This power can be referred to as static power. The third component is the leakage power $P_{leakage}$, which is due to sub-threshold conduction predominantly seen in nanometer technologies. Although leakage power cannot he discounted from the total power dissipation, static power is stressed for purposes of this illustration due to it's relatively high contribution to the total power dissipation of a device using interconnect current amplifiers. When only interconnects are considered in such a device, leakage power contribution is an order of magnitude less than static and dynamic power contributions.

Returning to FIG. 2, sense circuit 201 represents the circuit that must sense the signaling on an interconnect. NMOS device 202 is always on so that there is a continuous path to ground whenever PMOS driver 204 is on. Since leakage power is an order of magnitude less than static and dynamic power it can be omitted for clarity, although it should be noted that dynamic power increases with respect to line length since the interconnect capacitance increases as line length increases. Static power is due to flow of static current across the two resistances shown in FIG. 2, interconnect resistance 206 and the resistance of transistors 102 and 104 from FIG. 1, represented by the resistance of equivalent NMOS transistor 206 of FIG. 2.

It should also be noted that the W/L ratio of the termination transistors of a DCSA increases as wire length increases. Until about 4 mm the resistance of equivalent NMOS device 206 dominates. As wire length decreases from 4 mm to 1 mm, there is an increase in the static current and hence a corresponding increase in static power. After 4 mm interconnect resistance 206 starts to dominate and the interconnect resistance increases with increased wire length, which results in the decrease of static current, and hence, static power.

Figure 3:
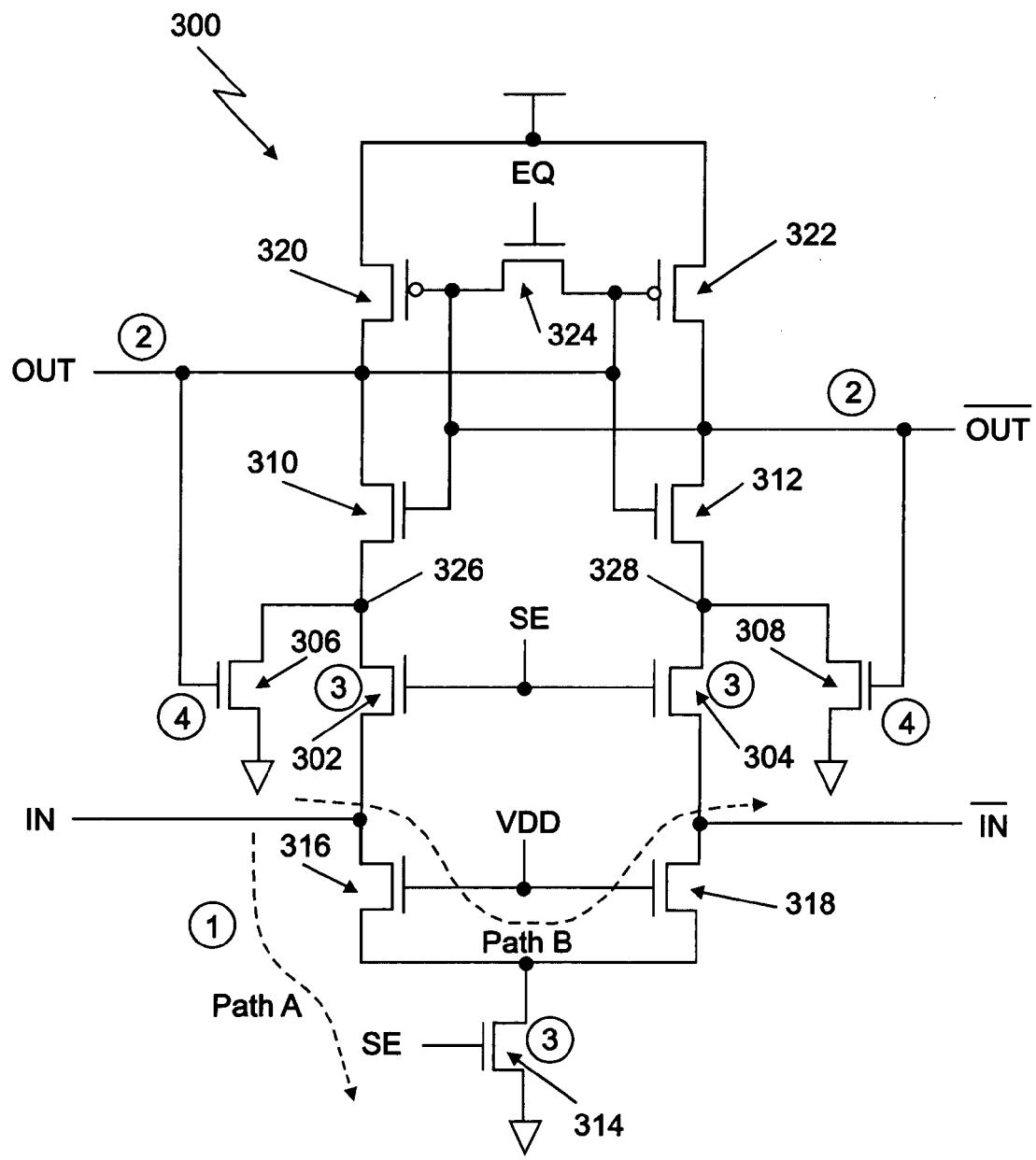
FIG. 3 is a schematic diagram of an example embodiment of the PA-DCSA circuit of the invention.

The circuit of FIG. 3, PA-DCSA circuit 300, can provide for reduced $P_{direct-path}$ static power according to at least some embodiments of the present invention. As can be seen in FIG. 3, decoupling devices 302 and 304 provide a decoupling mechanism to decouple the cross coupled inverters from current Path B, shown by a dotted arrow in FIG. 3. Decoupling devices 302 and 304 are implemented in this embodiment by transistors gated by the sense enable (SE) signal which enables and disables the sense amplifier. Another set of NMOS devices, transistors 306 and 308, provides a discharge mechanism. These devices maintain the drains of the cross coupled inverter NMOS transistors 310 and 312 at virtual ground and discharge the excess charge accumulated at their drains after the sense amplifier is disabled. Transistor 314 provides a selectively enabled low impedance path to ground and is also gated by the SE signal. Transistor 314 closes Path A to provide the path in series with transistors 316 and 318. Transistors 320 and 322 complete the cross-coupled inverters in FIG. 3, with transistor 324 holding the circuit in a meta stable state during the equalizing phase.

The operation of the PA-DCSA of FIG. 3 is also shown in the Figure, with the circled numerals indicating the operating process steps for the circuit. Initially, when the SE signal and EQ signal are both high, transistors 314, 316, and 318 are on and low impedance Path A is provided at step 1. Once a differential is formed the EQ signal goes low and the cross coupled inverter pair senses the differential and swings OUT and OUT bar to the respective voltages at step 2. After a delay the SE signal goes low turning off transistor 314 at step 3, thereby shutting off the direct path to ground, ideally disabling the sense amplifier. The decoupling devices, 302 and 304 also are off when the SE signal is off at step 3, thereby re-routing any current coming through the IN terminal through transistors 316 and 318 to drive the interconnect through Path B. Charges collected on nodes 326 and 328 are then discharged through the either one of the discharge devices 306 and 308 depending on whether OUT or OUT bar is high as indicated in FIG. 3 as step 4. Once the EQ signal goes high again, the SE signal goes high opening device 314 thereby preparing the sense amplifier for the next sensing cycle.

A self-timed mechanism for the PA-DCSA can be implemented where the circuit is used in a semiconductor chip by deriving the sense enable (SE) signal internally from the edges of the equalizing (EQ) signal. An embodiment of a device where the SE signal is derived from the EQ signal for this purpose is discussed below with respect to FIG. 4. Note that with the circuit of FIG. 3, once the outputs swing to their respective levels, even though a discharge path is provided there is typically no direct path from $V_{dd}$ to ground. If IN is high and IN bar is low, there might he a static current flowing from the PMOS driving IN to the NMOS sinking IN bar through Path B of FIG. 3, seemingly leading to a direct path from $V_{dd}$ to ground. However this path never forms in normal operation of the circuit because the switching frequency is so high that there will not be enough time to fully charge all the capacitances of the interconnects. In the event that driving current through Path B partially charges the interconnect capacitances, in the next cycle if IN bar goes low there will be a delay in discharging the charge that was accumulated. At the same time if IN bar goes high the interconnect will be charged quickly as there is already a small charge accumulation from the last cycle.

Tests of a circuit like that shown in FIG. 3 have shown a reduction in the static power dissipation, although energy consumed per switching activity increases with respect to line length due to an increase in interconnect capacitance. The performance of PA-DCSA over a standard DCSA circuit has been tested over various process geometries including 250 nm, 180 nm, 130 nm, 100 nm and 65 nm. Power savings of up to 24.5% of static power has been realized in the 250 nm technology with a line length range of 4 mm-15 mm. The average static power savings with 65 nm technology can be around 9.5%.

It cannot be over-emphasized that a circuit like that of FIG. 3 in which the decoupling mechanism, discharge mechanism, and selectively enabled low impedance path are all implemented by transistor devices is presented as an example only. A PA-DCSA circuit could be designed by one of ordinary skill in the art to rely on more complicated circuitry for these mechanisms. Switching devices of various types could be used to provide the means for decoupling, selectively enabling the low impedance path, and discharging the cross-coupled inverters. Even switching controlled by a processor or application specific integrated circuit (ASIC) could be used.

Figure 4:
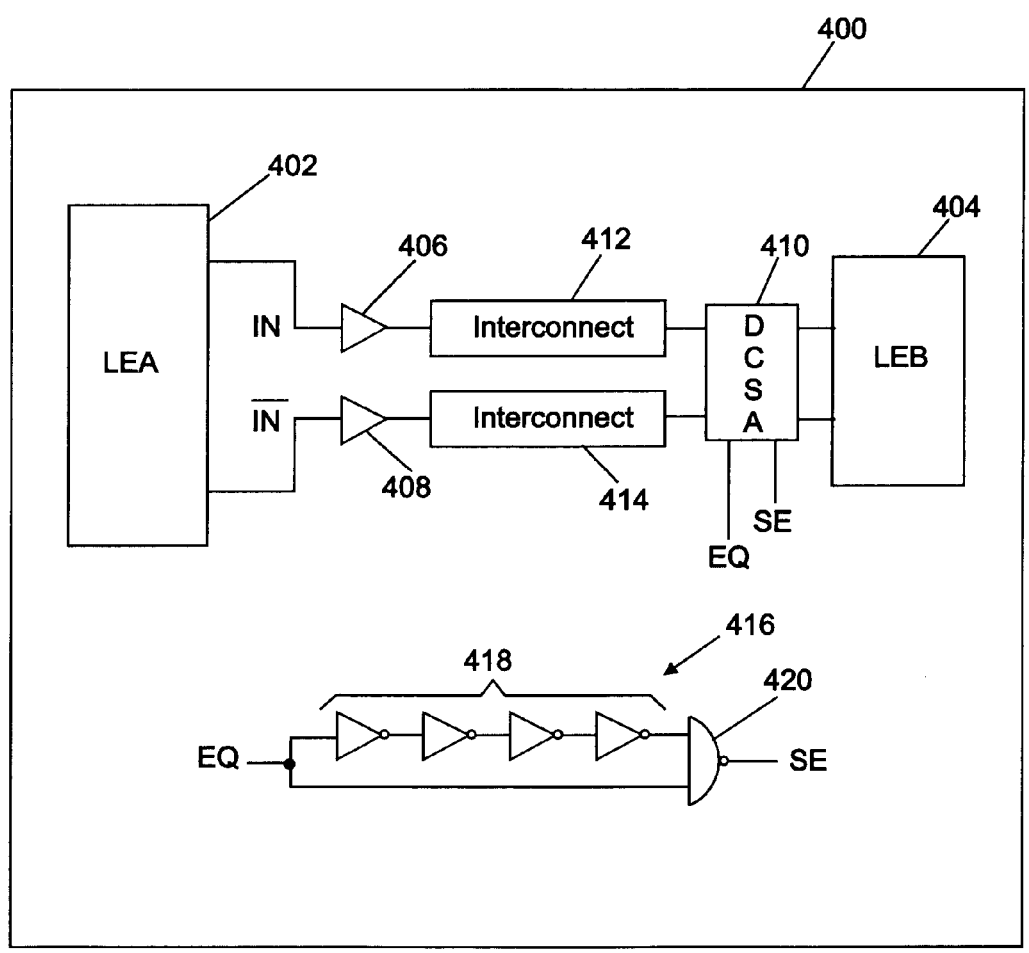
FIG. 4 is an example semiconductor device that makes use of an embodiment of the PA-DCSA circuit of the present invention.

A physical design for a semiconductor device using the PA-DCSA circuit can be implemented as shown in FIG. 4. Device 400 of FIG. 4 includes logic element A (LEA), 402 and logic element B (LEB), 404. Drivers 404 and 408 are provided for IN and IN bar signals, respectively. PA-DCSA circuit 410 is provided for interconnects 412 and 414. In such an application, a considerable difference is formed in the static currents when the equalizing (EQ) signal goes low. At the onset of the EQ signal going low, OUT and OUT bar terminals, originally held at $V_{dd}/2$, swing to the respective rails. When the SE and EQ signals are high the sense amplifier is enabled.

Still referring to FIG. 4, circuit 416 generates the SE signal from the EQ signal. Circuit 416 includes a plurality of inverters, 418, and NAND gate 420. The number of inverters can be altered to adjust the timing of the self-timed mechanism of the PA-DCSA circuit. In this example, when the SE signal goes low 100 ps after the EQ signal goes low, one of the currents in the NMOS transistors in Path B of the circuit in FIG. 3 is reduced during the time the SE signal is low and the direction of the other current is reversed with the same magnitude, resulting in the current in Path B of FIG. 3. This reduction in static current effectively reduces static power.

Specific embodiments of an invention have been herein described. One of ordinary skill in the semiconductor design arts will quickly recognize that the invention has numerous other embodiments. The following claims are in no way intended to limit the scope of the invention to the specific embodiments described.

The invention claimed is:

1. A semiconductor device comprising:
   a first logic element and a second logic element;
   at least two cross-coupled inverters connected between the first logic element and the second logic element to form a current sense amplifier, one of the at least two cross-coupled inverters having an output electrically connected to an out terminal and another output electrically connected to an out bar terminal;
   a decoupling mechanism connected to the at least two cross-coupled inverters, the decoupling mechanism also disposed to accept a sense enable signal that selectively enables and disables the current sense amplifier;
   a discharge mechanism connected to the at least two cross-coupled inverters to remove excess charge when the current sense amplifier is disabled;
   a selectively enabled low impedance path from at least one of the at least two cross-coupled inverters to ground; and
   a sense enable generating circuit to generate the sense enable signal from an equalizing signal in part by applying a delay to the equalizing signal.

2. The semiconductor device of claim 1 wherein the decoupling mechanism further comprises two decoupling devices connected one each to one of the at least two cross-coupled inverters, each of the two decoupling devices further gated by the sense enable signal.

3. The semiconductor device of claim 1 wherein the selectively enabled low impedance path comprises a transistor gated by the sense enable signal.

4. The semiconductor device of claim 2 wherein the discharge mechanism further comprises two discharge devices connected one each to one of the at least two cross-coupled inverters.

5. The semiconductor device of claim 2 wherein the selectively enabled low impedance path comprises a transistor gated by the sense enable signal.

6. The semiconductor device of claim 4 wherein the selectively enabled low impedance path comprises a transistor gated by the sense enable signal.

7. A method of operating a current sense amplifier in response to an equalizing signal, the method comprising:
   delaying the equalizing signal to produce a sense enable signal;
   providing a low impedance path from at least one of two cross-coupled inverters to ground when the equalizing signal and the sense enable signal are high;
   swinging a voltage at an out terminal when the equalizing signal goes substantially low;
   shutting off the low impedance path and any decoupling devices when the sense enable signal goes low after the equalizing signal goes low to disable the current sense amplifier and reduce static power while driving current into an interconnect; and
   discharging at least one of the two cross-coupled inverters.

8. The method of claim 7 wherein the providing of the low impedance path comprises gating a transistor.

9. A current sensing apparatus that responds to an equalizing signal, the current sensing apparatus comprising:
   means for delaying the equalizing signal to produce a sense enable signal;
   means for providing a low impedance path from at least one of two cross-coupled inverters to ground when the equalizing signal and the sense enable signal are high;
   means for swinging a voltage at an out terminal when the equalizing signal goes substantially low;
   means for shutting off the low impedance path and any decoupling devices when the sense enable signal goes low after the equalizing signal goes low to disable the current sense amplifier and reduce static power while driving current into an interconnect; and
   means for discharging at least one of the two cross-coupled inverters.

* * * * *